(12) United States Patent
Kushnarenko et al.

(10) Patent No.: US 8,760,930 B1
(45) Date of Patent: Jun. 24, 2014

(54) MEMORY DEVICE WITH SOURCE-SIDE SENSING

(71) Applicant: (Spansion Inc.) Spansion LLC., Sunnyvale, CA (US)

(72) Inventors: Alexander Kushnarenko, Haifa (IL); Yoram Betser, Mazkeret Batya (IL)

(73) Assignee: Spansion LLC., Sunnyvale, CA (US)

( * ) Notice: Subject to any disclaimer, the term of this patent is extended or adjusted under 35 U.S.C. 154(b) by 0 days.

(21) Appl. No.: 13/769,398

(22) Filed: Feb. 18, 2013

(51) Int. Cl.
*G11C 16/06* (2006.01)

(52) U.S. Cl.
USPC ............. 365/185.23; 365/185.05; 365/185.21

(58) Field of Classification Search
USPC .............. 365/185.03, 185.05, 185.21, 185.23
See application file for complete search history.

(56) References Cited

U.S. PATENT DOCUMENTS

| | | | |
|---|---|---|---|
| 5,650,959 A | 7/1997 | Hayashi et al. | |
| 5,837,584 A * | 11/1998 | Lu et al. | 438/263 |
| 6,130,452 A | 10/2000 | Lu et al. | |
| 6,175,519 B1 | 1/2001 | Lu et al. | |
| 6,528,839 B2 * | 3/2003 | Shukuri et al. | 257/314 |
| 6,731,542 B1 | 5/2004 | Le et al. | |
| 6,744,674 B1 | 6/2004 | Le et al. | |
| 7,339,846 B2 * | 3/2008 | Lin et al. | 365/203 |
| 7,542,363 B2 * | 6/2009 | Kubo et al. | 365/207 |
| 7,885,132 B2 * | 2/2011 | Kubo et al. | 365/211 |
| 8,492,826 B2 * | 7/2013 | Ajika et al. | 257/324 |
| 2008/0013379 A1 | 1/2008 | Lin et al. | |
| 2010/0238746 A1 | 9/2010 | Chen | |

\* cited by examiner

*Primary Examiner* — Gene Auduong
(74) *Attorney, Agent, or Firm* — Eitan, Mehulal & Sadot (57) ABSTRACT

A source-sensing configuration for non-volatile memory devices to simultaneously read 2 bits in two different memory cells sharing a same word line is disclosed. In a first cell arrangement, a drain of a first read cell is biased and its source and that of two adjacent cells in a direction towards the second read cell are connected through source bit lines to a source sense amplifier. In a second cell arrangement, the drain of the second read cell is biased and its source and that of its two adjacent cells in a direction towards the first read cell are connected through source bit lines to a source sense amplifier. A memory cell acts as a cell pipe and joins together the first and second cell arrangements. Driving all six source bit lines simultaneously allows the 2 bits to be simultaneously read while maintaining currents due to pipe effect substantially minimized.

20 Claims, 3 Drawing Sheets

MEMORY DEVICE WITH SOURCE-SIDE SENSING

FIELD OF THE INVENTION

The present invention relates to non-volatile memory devices generally and to non-volatile memory devices with source-side sensing in particular.

BACKGROUND OF THE INVENTION

Non-volatile memory (NVM) devices generally include an array of NVM cells arranged into rows and columns. Each memory cell may have a gate, a source and a drain, where the gate controls current flow between the source and the drain. The amount of current flow generally depends on the gate voltage magnitude, the drain-source voltage, and a threshold voltage of the memory cell, where the threshold voltage is adjusted depending on the state of the memory cell. Usually, a high threshold voltage a low cell current define a Programmed State in the memory cell, and a low threshold voltage and a high cell current define an Erased State in the memory cell.

The NVM cell array is usually arranged so that cells in a same row are interconnected by a word line connecting the gate of each cell, and cells in a same column are interconnected by two bit lines, one connecting to the source of each cell and one connecting to the drain of each. The memory cell array may include a virtual ground architecture (VGA) wherein two neighboring cells in a same row may share a same bit line, and where the bit line for one cell may serve as a source bit line while for the neighboring cell it may serve as a drain bit line. Examples of VGA architectures are described in U.S. Pat. No. 5,650,959; U.S. Pat. No. 6,130,452; and U.S. Pat. No. 6,175,519; all of which are incorporated herein by reference in their entirety.

The memory cells in NVM devices may be configured to store more than one bit, for example two bits. A first bit is typically stored on one side of the memory cell and the second bit is stored on the other side of the same memory cell. Reading of each bit is executed by applying a source voltage to the side of the memory cell where the bit is located and a drain voltage to the opposite side of the cell. In addition, each side of the memory cell can store more than one bit, for example, two bits. Storing of more than one bit may be achieved by adjusting the magnitude of the programming voltage and the threshold voltage of the memory cell. The state of these bits may be determined during a read operation by sensing the current drawn by the memory cell while a read voltage is applied to the gate.

One technique used to determine the state of the bits includes "drain-side" sensing which includes connecting the drain to a sensing circuit and connecting the source to ground. A current drawn by the cell (flowing into the drain) from the sensing circuit is compared by the sensing circuit to a reference "read" current to allow the state of the read bit to be determined. For example, if the current drawn by the cell is greater than the reference read current, then the bit being read may be considered to be in the erased state while if the current drawn is less than the reference read current, the bit may be considered to be in the programmed state. Alternatively to using the drain-side sensing technique, the state of the bits in the cell may be determined using "source-side" sensing, where the sensing circuit is connected to the source and the current flowing out of the source is measured by the sensing circuit and compared to the reference read current.

In memory cell arrays with virtual ground architecture, the reliability of the above-mentioned sensing techniques may be increased by introducing a "read" margin which is associated with the reference read current. In such cases, a "sensed" current (flowing into the drain or out of the source) must be greater or lesser than the reference read current by the read margin in order to positively establish the state of the bits. For example, if the sensed current exceeds the reference read current by a value which may be equal to or greater than the read margin, the bit may be considered as erased, and if it is less than the reference read current by a value equal to or greater than the read margin, the bit may be considered as programmed. This may prevent incorrectly reading bits due to conditions typically known as "neighbor effect", or "pipe" effect, wherein the sensed current flowing through the cell may be affected by leakage currents ("pipe" currents) flowing though neighboring memory cells.

Pipe currents are generally created as a result of a difference between the drain/source voltage level of the cell that is being read and the drain/source voltage level across one or more neighboring cells which are not being read. The pipe current can either increase or reduce the sensed current, and thus change the apparent logical value of the bits in the read memory cell. The size of the pipe current may depend on the neighboring cell's operating condition and which may include, for example, whether it is in an erased or programmed state, temperature, applied gate voltage, parasitic capacitance between bit lines, and transient response of the memory cell.

Known devices and/or methods attempt to deal with the problem of pipe currents and accurate reading of "sensed" current in memory cells, some of which are mentioned below.

US 2008/0013379 to Lin et al., relates to "a memory includes first and second target memory cells in a plurality of electrically adjacent memory cells all sharing a word line. The two target memory cells are separated from each other by at least one additional memory cell, and first current path terminals of the target memory cells bracket second current path terminals of the target memory cells electrically along the word line. The two target memory cells are read by connecting the first current path terminals of the two target memory cells to ground, precharging the second current path terminals of the two target memory cells to respective precharged states, and while both second current path terminals are in their respective precharged states, initiating a sense operation to read both the first and second target memory cells substantially simultaneously."

US 2010/0238746 to Chen, relates to "a reading circuit in a memory, having a first memory cell coupled to a first bit line and a second bit line, a second memory cell coupled to the second bit line and a third bit line and a third memory cell coupled to the third bit line and a fourth bit line, is provided. The reading circuitry includes a sensing circuit, a drain side bias circuit, a first selection circuit and a second selection circuit. The drain side bias circuit provides a drain side bias. The first selection circuit connects the second bit line to the drain side bias circuit to receive the drain side bias in a read operation mode. The second selection circuit connects the first bit line and the fourth bit line to the sensing circuit in the read operation mode, so that the sensing circuit senses a current of the first memory cell."

U.S. Pat. No. 6,731,542 to Le et al., relates to "a memory circuit arrangement for sensing current in a target cell during a read operation is disclosed. According to one exemplary embodiment, the memory circuit arrangement comprises the target cell and a first neighboring cell adjacent to the target cell. The first target cell has a first bit line connected to ground; the target cell also has a second bit line connected to a sensing circuit. The first neighboring cell shares the second bit line with the target cell; the first neighboring cell also has a third bit line connected to the sensing circuit during the read operation. The memory circuit arrangement results in increased error margins in a fast and accurate manner during the read operation of the target cell."

U.S. Pat. No. 6,744,674 to Le et al. relates to "a memory circuit senses current in a target cell during a read operation. According to one exemplary embodiment, the memory circuit comprises the target cell, a first neighboring cell, and an operational amplifier. The first target cell has a first bit line connected to ground; the target cell also has a second bit line connected to a drain voltage. A sensing circuit is coupled at a first node to at least one of the first bit line or the second bit line. The first neighboring cell has a third bit line connected to a second node. The operational amplifier has an output terminal connected at the second node to the third bit line. The operational amplifier has a noninverting input terminal connected to said first node, and also has an inverting input terminal connected to the second node."

SUMMARY OF THE PRESENT INVENTION

There is provided, according to an embodiment of the present invention, a circuit arrangement for sensing a state of one or two bits in a plurality of non-volatile memory cells in non-volatile memory devices comprising a first memory cell comprising a first bit of the one or two bits having a first side connected through a first bit line to a drain bias circuit and a second side connected through a second bit line to a source driver circuit; a second memory cell having a first side connected to the second bit line and a second side connected through a third bit line to a source driver circuit; a third memory cell having a first side connected to the third bit line and a second side connected through a fourth bit line to a source driver circuit; a fourth memory cell having a first side connected to the fourth source bit line and a second side connected through a fifth bit line to a source driver circuit; a fifth memory cell having a first side connected to the fifth bit line and a second side connected through a sixth bit line to a source driver circuit; a sixth memory cell having a first side connected to the sixth bit line and a second side connected through a seventh bit line to a source driver circuit; and a seventh memory cell comprising a second bit of the one or two bits having a first side connected through the seventh bit line to a to a source driver circuit and a second side connected through an eight bit line to a drain bias circuit.

There is further provided, according to an embodiment of the present invention, a non-volatile memory device comprising the circuit arrangement for sensing a state of one or two bits in a plurality of non-volatile memory cells comprising a first memory cell comprising a first bit of the one or two bits having a first side connected through a first bit line to a drain bias circuit and a second side connected through a second bit line to a source driver circuit; a second memory cell having a first side connected to the second bit line and a second side connected through a third bit line to a source driver circuit; a third memory cell having a first side connected to the third bit line and a second side connected through a fourth bit line to a source driver circuit; a fourth memory cell having a first side connected to the fourth source bit line and a second side connected through a fifth bit line to a source driver circuit; a fifth memory cell having a first side connected to the fifth bit line and a second side connected through a sixth bit line to a source driver circuit; a sixth memory cell having a first side connected to the sixth bit line and a second side connected through a seventh bit line to a source driver circuit; and a seventh memory cell comprising a second bit of the one or two bits having a first side connected through the seventh bit line to a to a source driver circuit and a second side connected through an eight bit line to a drain bias circuit.

According to an embodiment of the present invention, the second, third, and fourth bit line are connected to a first source driver circuit, and the fifth, sixth, and seventh bit line are connected to a second source driver circuit.

According to an embodiment of the present invention, the first and eighth bit lines are connected to a same drain bias circuit.

According to an embodiment of the present invention, the circuit arrangement further comprises an eighth memory cell adjacent to the first memory cell having a first side connected through a ninth bit line to a drain bias circuit and a second side connected to the first bit line; and a ninth memory cell adjacent to the seventh memory cell having a first side connected to the eighth bit line and a second side connected through a tenth bit line to a drain bias circuit.

According to an embodiment of the present invention, the first and eighth bit lines are connected to a same drain bias circuit.

According to an embodiment of the present invention, the circuit arrangement further comprises a tenth memory cell adjacent to the eighth memory cell having a first side connected through an eleventh bit line to a drain bias circuit and a second side connected to the ninth bit line; and an eleventh memory cell adjacent to the ninth memory cell having a first side connected to the tenth bit line and a second side connected through a twelfth bit line to a drain bias circuit.

According to an embodiment of the present invention, the ninth bit line and the eleventh bit line are connected to a same drain bias circuit, and the tenth bit line and the twelfth bit line are connected to a same drain bias circuit.

According to an embodiment of the present invention, the first and eighth bit lines are connected to a same drain bias circuit.

There is provided, according to an embodiment of the present invention, a method for sensing a state of one or two bits in a plurality of non-volatile memory cells in non-volatile memory devices, the method comprising connecting a first side of a first memory cell comprising a first bit of the one or two bits through a first bit line to a drain bias circuit and connecting a second side through a second bit line to a source driver circuit; connecting a first side of a second memory cell to the second bit line and connecting a second side through a third bit line to a source driver circuit; connecting a first side of a third memory cell to the third bit line and connecting a second side through a fourth bit line to a source driver circuit; connecting a first side of a fourth memory cell to the fourth source bit line and connecting a second side through a fifth bit line to a source driver circuit; connecting a first side of a fifth memory cell to the fifth bit line and connecting a second side through a sixth bit line to a source driver circuit; connecting a first side of a sixth memory cell to the sixth bit line and connecting a second side through a seventh bit line to a source driver circuit; and connecting a first side of a seventh memory cell comprising a second bit of the one or two bits through the seventh bit line to a to a source driver circuit and connecting a second side through an eight bit line to a drain bias circuit.

According to an embodiment of the present invention, the method further comprises connecting the second, third, and fourth bit line to a first source driver circuit, and connecting the fifth, sixth, and seventh bit line to a second source driver circuit.

According to an embodiment of the present invention, the method further comprises connecting the first and eighth bit lines to a same drain bias circuit.

According to an embodiment of the present invention, the method further comprises connecting a first side of an eighth memory cell adjacent to the first memory cell through a ninth bit line to a drain bias circuit and connecting a second side to the first bit line; and connecting a first side of a ninth memory cell adjacent to the seventh memory cell through the eighth bit line and connecting a second side through a tenth bit line to a drain bias circuit.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that prior art circuits and methods for sensing memory cells in NVM devices, whether using drain-sensing or source-sensing techniques, do not satisfactorily solve the problem of pipe currents and accurate reading of "sensed" current in memory cells.

In previously mentioned prior art US 2008/0013379, a drain-sensing configuration commonly referred to as "SDDDddds" is used to simultaneously read 2 bits in two different memory cells sharing a same word line. In this configuration, six memory cells are divided into two groups of three cells, the groups adjacent to one another. In a first group, the source of a first cell to be read ("read" cell) is grounded and its drain and that of two adjacent cells in a direction towards the second read cell are connected to a drain sense amplifier (SDDD cell arrangement). In the second group, the source of the second read cell is grounded and its drain and that of its two adjacent cells in a direction towards the first read cell are connected to a drain sense amplifier (ddds cell arrangement) through drain bit lines. A memory cell acts as a cell pipe and joins together the SDDD and ddds cell arrangements. A drawback with this configuration is that a high drain voltage is required for sensing (approximately 1.5 V) and the reliability of the sensing may be affected by lower supply voltage levels as well as by noise and supply voltage variations.

In previously mentioned prior art US 2010/0238746, a source-sensing configuration commonly referred to as "DDSS Shield" is used for reading one bit in a memory cell. In this configuration, the drain of the read cell and that of a first adjacent cell on one of its sides are connected to a drain bias circuit through drain bit lines, and the source of the read cell and the source of a second adjacent cell on an opposing side of the read cell are connected to a source sense amplifier. A third cell adjacent to the second cell on an opposing side to the read cell is connected through a source bit line to a source side shielding circuit. A drawback with this configuration is that a pipe current may develop across the source/drain of a memory cell adjacent to the third cell on an opposing side to the second cell. The pipe current magnitude depends on the state of the memory cells (programmed or erased) and thus the shielding protection voltage depends on the pipe state. For an erased pipe the shielding voltage would be low and for a programmed pipe, the shielding voltage would be high. This will create a pipe dependent drain-source voltage difference and high leakage pipe current through the third cell. An additional drawback is that the source side sensing path and the source side shielding path are not matched and have different transient response. This significantly limits memory cells access time.

Applicants have realized that the aforementioned drawbacks and other problems related to the generating of pipe currents and accurate reading of sensed currents in memory cells may be ameliorated by a using a source-sensing configuration which may be referred to as "DSSSsssd". The DSSSsssd configuration may be suitable in NVM devices for simultaneous reading of 2 bits in two different memory cells sharing a same word line, and in particular for memory cells in a VGA. In this configuration the drain of a first read cell is drain biased and its source and that of two adjacent cells in a direction towards the second read cell are connected to a source sense amplifier (DSSS cell arrangement) through source bit lines. In a minor image symmetrical arrangement of the source/drain connections for the first read cell, the drain of the second read cell is drain biased and its source and that of its two adjacent cells in a direction towards the first read cell are connected to a source sense amplifier (sssd cell arrangement) through source bit lines. A memory cell acts as a cell pipe and joins together the DSSS and sssd cell arrangements. Driving all six source bit lines simultaneously allows for the 2 bits to be simultaneously read while maintaining currents due to pipe effect substantially minimized.

Applicants have further realized that the above DSSSsssd configuration may be modified to suit other type of configurations, for example, DDSSSsssdd wherein a cell adjacent to the drain side of each of the read cells is also drain biased. Additional types of modified configurations may include DDDSSSsssddd, DSSSSsssssd, DDSSssdd, among others. Some advantages to using these source-side sensing configurations over the prior art are that source-side sensing may be performed using lower power supply voltages (compared to drain-side sensing), resulting in lower NVM device power requirements; pipe currents are substantially eliminated allowing more accurate reading of sensed currents; and increased sensing speed due to faster bit line stabilization.

Figure 1:
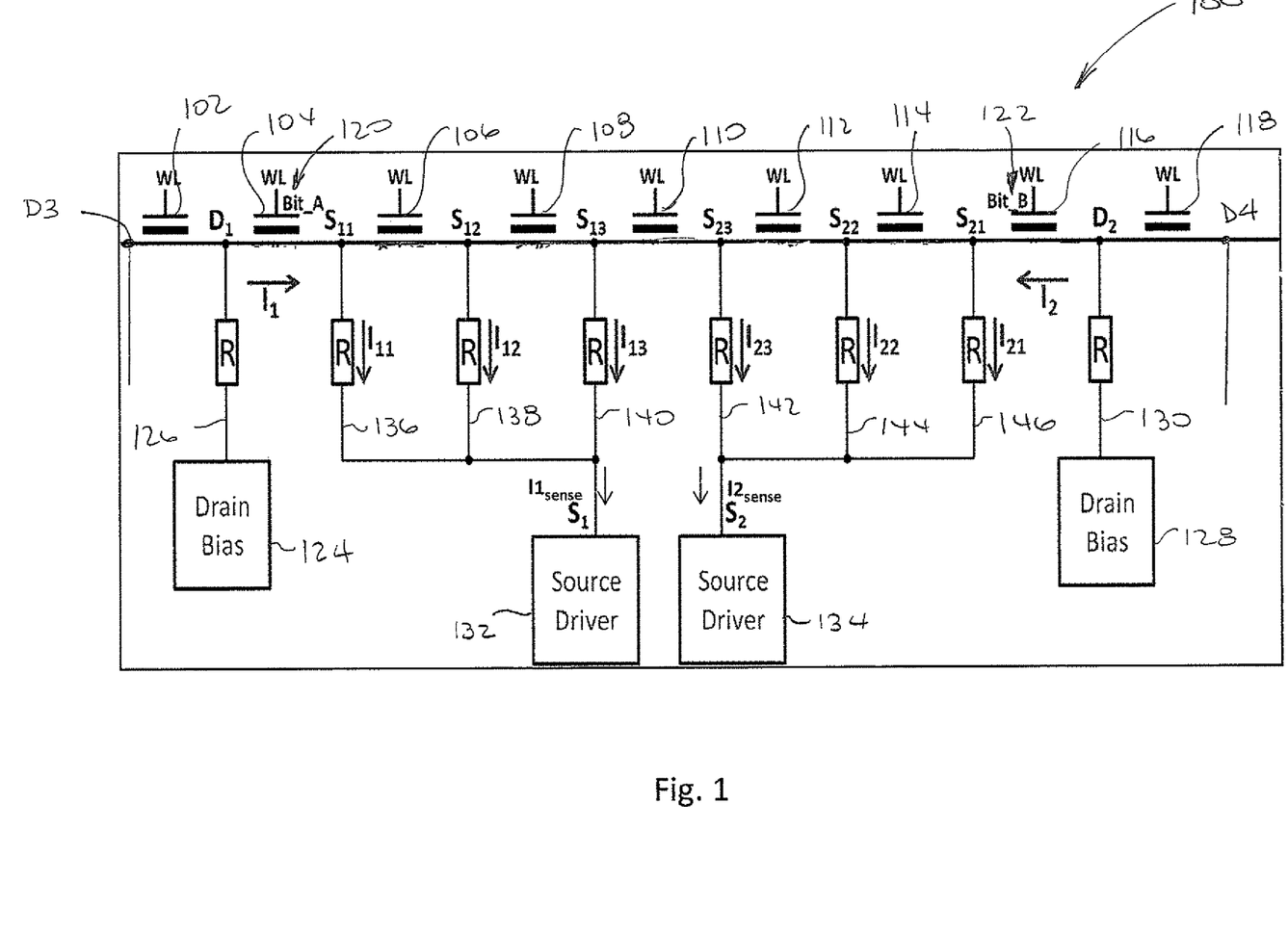
FIG. 1 schematically illustrates an exemplary non-volatile memory device including a source-side sensing configuration for reading two bits and having a reduced pipe current, according to an embodiment of the present invention.

Reference is now made to FIG. 1 which schematically illustrates an exemplary non-volatile memory device 100 including a DSSSsssd source-side sensing configuration to simultaneously read two stored bits A 120 and B 122 with reduced pipe effect, according to an embodiment of the present invention. NVM device 100 may be a charge trapping memory device such as, for example, a flash memory device, or may be any other type of memory device which includes floating gate memory cells. NVM device 100 may include a plurality of NVM cells arranged in an array, for example in rows and columns, and arranged in virtual ground architecture (VGA). NVM device 100 may additionally include appropriate control circuitry, and word line and bit line decoding/sensing circuitry. NVM 100 may be exemplified by a first memory cell 102, a second memory cell 104, a third memory cell 106, a fourth memory cell 108, a fifth memory cell 110, a sixth memory cell 112, a seventh memory cell 114, an eight memory cell 116, and a ninth memory cell 118 although a skilled person will realize that the number of memory cells which may be arranged in a same array row may number tens, hundreds, thousands, tens of thousands, or more memory cells, and that the number of array rows may number in the tens, hundreds, thousands, tens of thousands, or more rows NVM device 100 may be further exemplified by drain bias circuitry 124 and 128 configured to apply a drain biasing voltage to the drain of the memory cells, and by source driver circuitry 132 and 134 configured to sense source current flow from the memory cells.

According to an embodiment of the present invention, the DSSSsssd source-side sensing configuration for simultaneously reading a bit A 120 stored in a right side of memory cell 104 and a bit B 122 stored in a left side of memory 116 includes memory cells 104, 106 and 108 arranged in a DSSS configuration; and memory cells 112, 114, and 116, arranged in a sssd configuration; with memory cell 110 acting as a pipe cell interconnecting the two memory cell configurations. In the DSSS configuration, a left side of left end memory cell 104 is connected at node D1 through bit line 126 to drain bias circuit 124 and on its right side (which stores bit A 120) at node S11 through bit line 136 to source driver circuit 132; first neighbor memory cell 106 is connected on its left side to memory cell 104 at node S11 and shares bit line 136 with memory cell 104, and on its right side at node S12 through bit line 138 to source driver circuit 132; second neighbor memory cell 108 is connected on its left side to memory cell 106 at node S12 and shares bit line 138 with memory cell 106, and on its right side at node S13 through bit line 140 to source driver circuit 132. In the sssd configuration, a right side of right end memory cell 116 is connected at node D2 through bit line 130 to drain bias circuit 128 and on its left side (which stores bit B 122) at node S21 through bit line 146 to source driver circuit 134; first neighbor memory cell 114 is connected on its right side to memory cell 116 at node S21 and shares bit line 146 with memory cell 116, and on its left side at node S22 through bit line 144 to source driver circuit 134; second neighbor memory cell 112 is connected on its right side to memory cell 114 at node S22 and shares bit line 144 with memory cell 114, and on its left side at node S23 through bit line 142 to source driver circuit 134. Pipe cell 110 connects on the left side to memory cell 108 at node S13 and shares bit line 140 with memory cell 108 to source driver circuit 132, and on the right side to memory cell 112 at node S23 and shares bit line 142 with memory cell 112 to source driver circuit 134. At the ends, the sides of memory cells 102 and 118 not connected to D1 and D2 respectively, may be left floating, or may be connected to the drain bias circuits as will be described further no with regards to the DDSSSsssdd configuration.

Applicants have realized that using the present DSSSsssd configuration with right end memory cell 104 and left end memory cell 116 as active memory cells; and memory cells 106, 108, 112, and 114 as part of the source current sensing path; the logical state of the memory cells in the source sensing path does not substantially impact the generation of a pipe current. Furthermore, the pipe current is essentially influenced by a voltage drop across pipe cell 110 (voltage Vds between drain and source of the pipe cell). Therefore, by maintaining the voltage drop across pipe cell 110 to a minimum, regardless of the state of the pipe cell (erased or programmed), pipe currents may be substantially minimized. Applicants have further realized that the DSSSsssd configuration may be simultaneously replicated along the row, for example, by connecting memory cells (not shown) to the left of memory cell 102 and/or to the right of memory cell 118 in the DSSSsssd configuration. Furthermore, the DSSSsssd configuration may be implemented simultaneously in a plurality of rows.

Referring to the figure, $I_{SENSE1}$ is the sensed source current from reading bit A 120, and is the sum of source currents $I_{11}$, $I_{12}$, and $I_{13}$ flowing through bit lines 136, 138, and 140, respectively. This current $I_{SENSE1}$ is substantially equal to a current $I_{1\ which}$ is the current which flows from drain bias circuit 124 through node D1 and across the drain-source of memory cell 104 to node S11. As node S11 is connected to source driver circuit 132, there is a relatively large voltage drop across the drain-source of memory cell 104. The voltage at node S11 may be given by the following equation:

$$VS11 = VS1 + (I_{11})R = VD1 = (I_1)R104$$

where VS1 is the sensing voltage of source driver circuit 132; R is the resistance of bit line 136 (same R assumed for all bit lines in the row); $I_{11}$ is the sense current flowing through the bit line from node S11 to source driver circuit 132; and R104 is the resistance across the drain-source of memory cell 104.

A voltage drop across memory cells 106 and 108 is substantially minimal as both sides of the memory cells are substantially at a same voltage; both sides of each memory cell connected to source driver circuit 132 through nodes S11, S12, and S13, respectively. As a result, the currents $I_{12}$ and $I_{13}$ flowing from nodes S12 and S13 through bit lines 138 and 140 are very small. These currents $I_{12}$ and $I_{13}$ may be in the order of one to two orders of magnitude smaller than $I_{11}$, for example, if in is approximately 10 µA, then $I_{12}$ and $I_{13}$ may be approximately 1 µA and 0.1 µA, respectively. The voltages at nodes S12 and S13 may be given by the following equations:

$$VS12 = VS1 + (I_{12})R = VS11 - (I_{12} + I_{13})R106$$

and $$VS13 = VS1 + (I_{13})R = VS12 - (I_{13})R108$$

where R106 and R108 are the resistances across the drain-source of memory cells 106 and 108; and 112 and 113 are the sense currents flowing through the bit line from node S12 and S13 to source driver circuit 132, respectively.

It may be appreciated from the above description and equations that due to the very small current $I_{13}$ the voltage VS13 at node S13 is substantially the same as the sensing voltage VS1 of source driver circuit 132.

In a similar analysis, $I_{SENSE2}$ is the sensed source current from reading bit B 122, and is the sum of source currents $I_{21}$, $I_{22}$, and $I_{23}$ flowing through bit lines 112, 114, and 116, respectively. This current $I_{SENSE2}$ is substantially equal to a current $I_2$ which is the current which flows from drain bias circuit 128 through node D2 and across the drain-source of memory cell 1116 to node S21. As node S21 is connected to source driver circuit 134, there is a relatively large voltage drop across the drain-source of memory cell 104. The voltage at node S21 may be given by the following equation:

$$VS21 = VS2 + (I_{21})R = VD2 - (I_2)R116$$

where VS2 is the sensing voltage of source driver circuit 134; R is the resistance of bit line 146 (same R assumed for all bit lines in the row); $I_{21}$ is the sense current flowing through the bit line from node S21 to source driver circuit 134; and R116 is the resistance across the drain-source of memory cell 116.

A voltage drop across memory cells 114 and 112 is substantially minimal as both sides of the memory cells are substantially at a same voltage; both sides of each memory cell connected to source driver circuit 134 through nodes S21, S22, and S23, respectively. As a result, the currents $I_{22}$ and $I_{23}$ flowing from nodes S22 and S23 through bit lines 144 and 142 are very small. These currents $I_{22}$ and $I_{23}$ may be in the order of one to two orders of magnitude smaller than $I_{21}$, for example, if $I_{21}$ is approximately 10 μA, then $I_{22}$ and $I_{23}$ may be approximately 1 μA and 0.1 μA, respectively. The voltages at nodes S22 and S23 may be given by the following equations:

$$VS22 = VS2 + (I_{22})R = VS21 - (I_{22} + I_{23})R114$$

and $$VS23 = VS2 + (I_{23})R = VS22 - (I_{23})R112$$

where R112 and R114 are the resistances across the drain-source of memory cells 112 and 114; and $I_{22}$ and $I_{23}$ are the sense currents flowing through the bit line from node S22 and S23 to source driver circuit 134, respectively.

It may be appreciated from the above description and equations that due to the very small current $I_{23}$ the voltage VS23 at node S23 is substantially the same as the sensing voltage VS2 of source driver circuit 134.

Therefore, for a substantially same sensing voltage VS1~VS2 in source driver circuits 132 and 134, respectively, VS13~VS23, so that the pipe current through pipe cell 110 may be given by:

$$I_{pipe} = (VS23 - VS13)/R110 \sim 0$$

where R110 is the resistance across the drain-source of pipe cell 11, and the pipe current may be determined to be substantially equal to 0 (essentially no pipe current).

Figure 2:
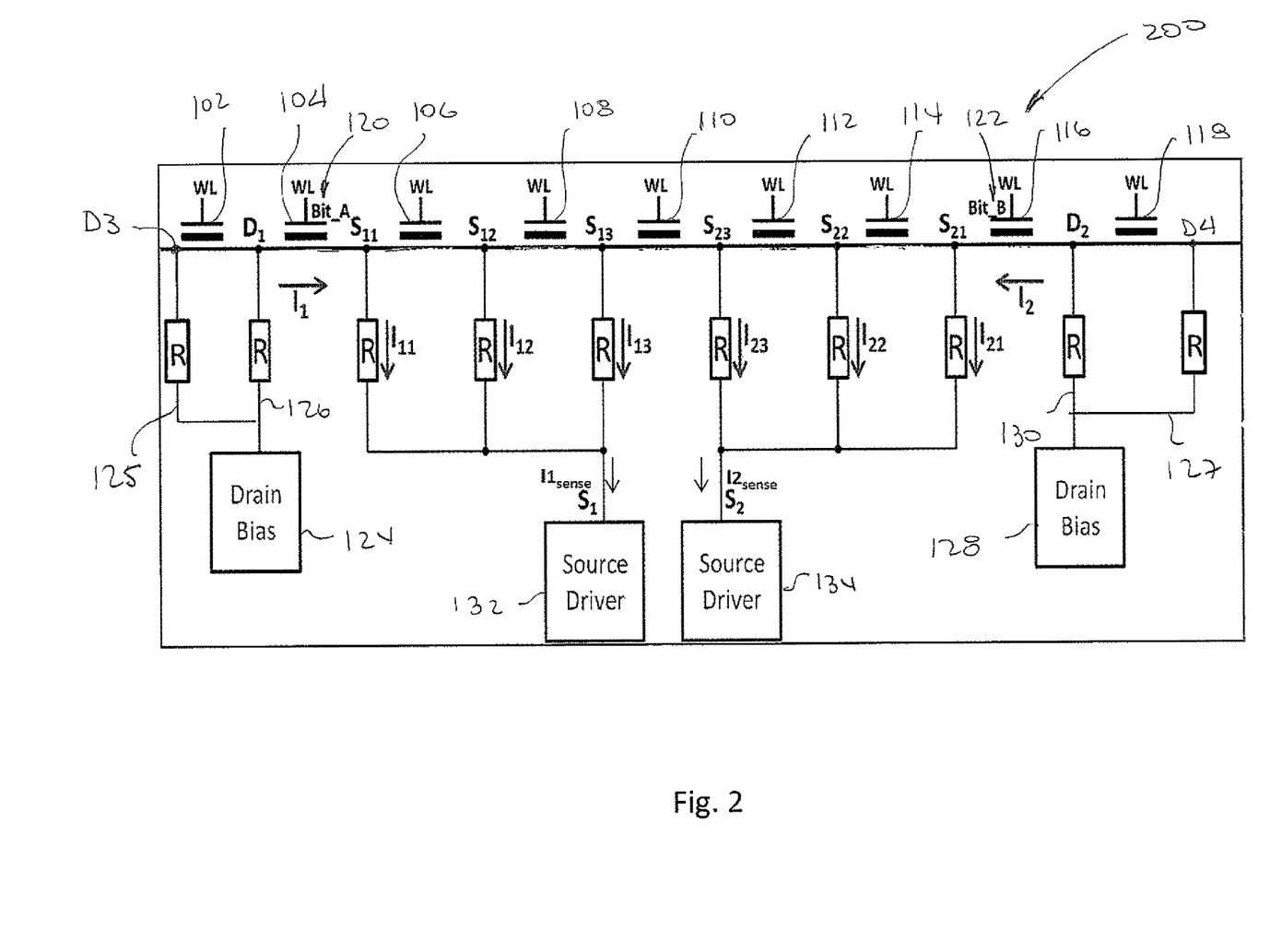
FIG. 2 schematically illustrates a second exemplary non-volatile memory device including a source-side sensing configuration for reading two bits and having a reduced pipe current, according to an embodiment of the present invention.

Reference is now made to FIG. 2 which schematically illustrates an exemplary non-volatile memory device 200 including a DDSSSsssdd source-side sensing configuration to simultaneously read stored bits A 120 and B 122 with reduced pipe effect, according to an embodiment of the present invention. NVM 200 may be exemplified by first memory cell 102, second memory cell 104, third memory cell 106, fourth memory cell 108, pipe cell 110, sixth memory cell 112, seventh memory cell 114, eight memory cell 116, ninth memory cell 118 arranged in a same array row similarly to NVM 100 in FIG. 1. NVM 200 may be further exemplified by drain bias circuits 124 and 128, and source driver circuits 132 and 134, as in NVM 100. Furthermore, the memory cells are arranged in a source-sensing configuration similar to NVM 100 except that both sides of active memory cells 102 and 118 are connected through bit lines to drain bias circuits 124 and 128, respectively, to form the DDSSSsssdd source-side sensing configuration. More particularly, both sides of memory cell 102 are connected to drain bias circuit 124, at a node D3 and node D1 through bit lines 125 and 126, respectively. In a similar fashion, both sides of memory cell 118 are connected to drain bias circuit 128 at a node D4 and node D2 through bit lines 127 and 130, respectively.

Applicants have realized that an NVM with memory cells arranged in a DDSSSsssdd configuration may allow faster charging of nodes D1 and D2 to which the drains of active memory cells 104 and 116 are connected, respectively. This may allow for faster charging of the source bit lines (bit lines 136, 138, 140, 142, 144 and 146) and possible further reduction in the substantially reduced pipe current through pipe cell 110 as (due to greater stability in VS13 and VS23). Additionally, generating of possible pipe currents through memory cells 102 and 118 is substantially eliminated as both sides of the memory cells are substantially at a same drain voltage Vd, and in some cases, the voltage on the other side of the memory cells may even be greater than the voltage on the side connected to active memory cells 104 and 116 (the voltages at D3 and D4 may even be greater than that at D1 and D2, respectively). As a result, Applicants have found that the DDSSSsssdd configuration introduces additional potential advantages to the DSSSsssd configuration as a result of the faster charging time and the elimination of pipe currents through the memory cells at both ends of the DDSSSsssdd configuration, including more accurate and more stable drain DC voltage levels; faster sensing time; and improved side leakage current suppression.

Figure 3:
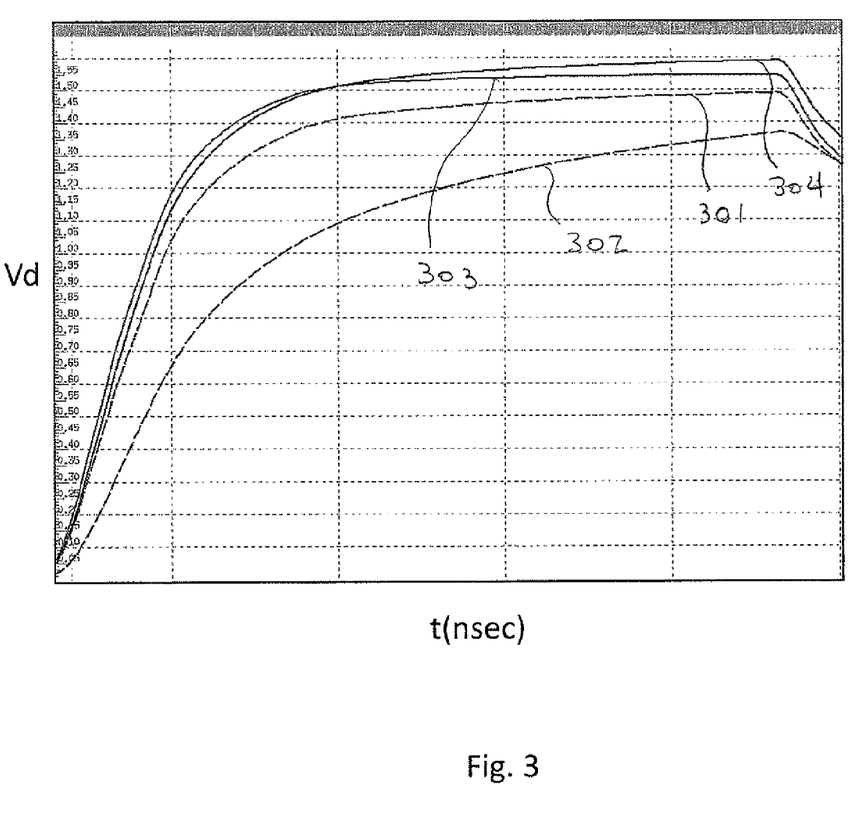
FIG. 3 is a comparison of graphs of measured transient voltage responses at drain connections of active memory cells in memory devices including the source-side sensing configurations shown in FIGS. 1 and 2, respectively, according to embodiments of the present invention.

Reference is now made to FIG. 3 which is a comparison of measured transient responses of the drain voltages Vd at nodes D1 and D3 in the source-side sensing configurations shown in FIGS. 1 and 2 for NVM devices 100 and 200, respectively, according to embodiments of the present invention. Graph 301 represents the measured voltage response at node D1 in the DSSSsssd configuration shown in FIG. 1, and graph 302 represents the measured voltage response on the other side of memory cell 102 (other side of D1) at node D3 when left floating in the DSSSsssd configuration. Graph 303 represents the measured voltage at node D1 in the DDSSSsssdd configuration shown in FIG. 2 and graph 304 represents the measured voltage at node D3 on the other side of memory cell 102 when connected in the DDSSSsssdd configuration to drain bias circuit 124 through drain bias line 125. Although the measurements were made with respect to nodes D1 and D3 in NVM devices 100 and 200, the measurements may be similarly made with respect to nodes D2 and D4 with substantially similar transient voltage responses expected.

From the graphs, it may be appreciated that the rise time of the drain voltage at node D1 in the DSSSsssd configuration (graph 301) is comparatively slower compared to that in the DDSSSsssdd configuration (graph 303). Additionally, the final drain voltage Vd at node D1 in the DSSSsssd configuration is comparatively lower than in the DDSSSsssdd configuration, graph 301 showing a maximum Vd of approximately 1.49V while graph 303 shows a maximum Vd of approximately 1.55V. As may be appreciated from graph 304, the faster rise time and higher Vd in the DDSSSsssdd configuration is supported by the connection of node D3 to drain bias circuit 124, which charges up to a maximum Vd of approximately 1.6V, greater than the 1.55V at node D1. The result of the charging up of node D3 to a voltage greater than that at node D1in the DDSSSsssdd configuration is that D3 provides the charging voltage for the DDSSS portion and prevents the generating of a leakage current through memory cell 102 in a direction to the left of the cell. From graph 304 it may be further appreciated that the voltage rise at node D3 is almost simultaneously with that at node D1 (graph 303) in the DDSSSsssdd configuration reaching a maximum Vd much faster than in the DSSSsssd configuration which shows the voltage at node D3 (graph 302) lagging behind the voltage rise at node D1 (graph 301) and reaching a much lower maximum voltage level. The faster voltage response shown for nodes D1 (graph 303) and D3 (graph 304) in the DDSSSsssdd configuration results in a faster activation of memory cell 104 (and memory cell 116 for nodes D2 and D4) and a faster sensing time compared to the DSSSsssd configuration.

Applicants have realized that the source-side sensing configuration described by the present application provides for a more improved non-volatile memory device compared to the drain-side sensing configuration described by the prior art. Drawbacks using drain-side sensing compared with source-side sensing include greater power consumption, higher operating voltage, slower sensing speed, and decreased reliability.

More particularly, the drain-side sensing configuration has higher power consumption as six drain bit lines are biased at approximately 1.5V compared to the source-side sensing configuration where six source bit lines are biased at approximately 0.1V and two drain bit lines at approximately 1.5V. Additionally, the drain-side sensing configuration requires higher operating voltages and a larger supply voltage Vcc as the lowest operating voltage in the drain-side sensing configuration is approximately 1.6V-1.7V (1.5V are required for the drain bit line biasing and another 100 mV-200 mV are required for the sense amplifiers). This is in contrast with a lower operating voltage required by the source-side sensing configuration of 1.5V (the highest voltage required is the 1.5V for biasing the two drain bit lines since the sense amplifiers, which require 100 mV-200 mV, are connected to the source bit lines so that a maximum voltage required by the source amplifiers and source bit lines is thus approximately 200 mV-300 mV). The need for a higher operating voltage makes the drain-side sensing configuration more sensitive to noise and supply voltage variations, which may affect the performance of the NVM device and decrease reliability, in contrast to the source-side sensing configuration which is more robust as there are greater margins to allow for supply voltage variations and noise. Furthermore, the sensing speed of the drain-side sensing configuration is slower compared to the source-side sensing speed as the time it takes the drain bit lines to charge to 1.5V with a tolerance of 1 mV (tolerance of 0.067%) is much longer than the time it takes the source bit lines to charge to 100 mV with a tolerance of 1 mV (tolerance of 1%).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A circuit arrangement for sensing a state of one or two bits in a plurality of non-volatile memory cells in non-volatile memory devices comprising:
  a first memory cell comprising a first bit of said one or two bits having a first side connected through a first bit line to a drain bias circuit and a second side connected through a second bit line to a source driver circuit;
  a second memory cell having a first side connected to said second bit line and a second side connected through a third bit line to a source driver circuit;
  a third memory cell having a first side connected to said third bit line and a second side connected through a fourth bit line to a source driver circuit;
  a fourth memory cell having a first side connected to said fourth source bit line and a second side connected through a fifth bit line to a source driver circuit;
  a fifth memory cell having a first side connected to said fifth bit line and a second side connected through a sixth bit line to a source driver circuit;
  a sixth memory cell having a first side connected to said sixth bit line and a second side connected through a seventh bit line to a source driver circuit; and
  a seventh memory cell comprising a second bit of said one or two bits having a first side connected through said seventh bit line to a source driver circuit and a second side connected through an eight bit line to a drain bias circuit.

2. The circuit arrangement of claim 1 wherein said second, third, and fourth bit line are connected to a first source driver circuit, and said fifth, sixth, and seventh bit line are connected to a second source driver circuit.

3. The circuit arrangement of claim 1 wherein said first and eighth bit lines are connected to a same drain bias circuit.

4. The circuit arrangement of claim 1 further comprising:
  an eighth memory cell adjacent to said first memory cell having a first side connected through a ninth bit line to a drain bias circuit and a second side connected to said first bit line; and a
  a ninth memory cell adjacent to said seventh memory cell having a first side connected to said eighth bit line and a second side connected through a tenth bit line to a drain bias circuit.

5. The circuit arrangement of claim 1 wherein said first and eighth bit lines are connected to a same drain bias circuit.

6. The circuit arrangement of claim 4 further comprising:
  a tenth memory cell adjacent to said eighth memory cell having a first side connected through an eleventh bit line to a drain bias circuit and a second side connected to said ninth bit line; and
  an eleventh memory cell adjacent to said ninth memory cell having a first side connected to said tenth bit line and a second side connected through a twelfth bit line to a drain bias circuit.

7. The circuit arrangement of claim 6 wherein said ninth bit line and said eleventh bit line are connected to a same drain bias circuit, and said tenth bit line and said twelfth bit line are connected to a same drain bias circuit.

8. The circuit arrangement of claim 6 wherein said first and eighth bit lines are connected to a same drain bias circuit.

9. A non-volatile memory device comprising a circuit arrangement for sensing a state of one or two bits in a plurality of non-volatile memory cells comprising:
  a first memory cell comprising a first bit of said one or two bits having a first side connected through a first bit line to a drain bias circuit and a second side connected through a second bit line to a source driver circuit;
  a second memory cell having a first side connected to said second bit line and a second side connected through a third bit line to a source driver circuit;
  a third memory cell having a first side connected to said third bit line and a second side connected through a fourth bit line to a source driver circuit;
  a fourth memory cell having a first side connected to said fourth source bit line and a second side connected through a fifth bit line to a source driver circuit;
  a fifth memory cell having a first side connected to said fifth bit line and a second side connected through a sixth bit line to a source driver circuit;

a sixth memory cell having a first side connected to said sixth bit line and a second side connected through a seventh bit line to a source driver circuit; and a seventh memory cell comprising a second bit of said one or two bits having a first side connected through said seventh bit line to a to a source driver circuit and a second side connected through an eight bit line to a drain bias circuit.

10. The device of claim 9 wherein said second, third, and fourth bit line are connected to a first source driver circuit, and said fifth, sixth, and seventh bit line are connected to a second source driver circuit.

11. The device of claim 9 wherein said first and eighth bit lines are connected to a same drain bias circuit.

12. The device of claim 9 wherein said circuit arrangement further comprises:
an eighth memory cell adjacent to said first memory cell having a first side connected through a ninth bit line to a drain bias circuit and a second side connected to said first bit line; and
a ninth memory cell adjacent to said seventh memory cell having a first side connected to said eighth bit line and a second side connected through a tenth bit line to a drain bias circuit.

13. The device of claim 12 wherein said first and eighth bit lines are connected to a same drain bias circuit.

14. The device of claim 12 wherein said circuit arrangement further comprises:
a tenth memory cell adjacent to said eighth memory cell having a first side connected through an eleventh bit line to a drain bias circuit and a second side connected to said ninth bit line; and a
an eleventh memory cell adjacent to said ninth memory cell having a first side connected to said tenth bit line and a second side connected through a twelfth bit line to a drain bias circuit.

15. The device of claim 14 wherein said ninth bit line and said eleventh bit line are connected to a same drain bias circuit, and said tenth bit line and said twelfth bit line are connected to a same drain bias circuit.

16. The device of claim 14 wherein said first and eighth bit lines are connected to a same drain bias circuit.

17. A method for sensing a state of one or two bits in a plurality of non-volatile memory cells in non-volatile memory devices comprising:
connecting a first side of a first memory cell comprising a first bit of said one or two bits through a first bit line to a drain bias circuit and connecting a second side through a second bit line to a source driver circuit;
connecting a first side of a second memory cell to said second bit line and connecting a second side through a third bit line to a source driver circuit;
connecting a first side of a third memory cell to said third bit line and connecting a second side through a fourth bit line to a source driver circuit;
connecting a first side of a fourth memory cell to said fourth source bit line and connecting a second side through a fifth bit line to a source driver circuit;
connecting a first side of a fifth memory cell to said fifth bit line and connecting a second side through a sixth bit line to a source driver circuit;
connecting a first side of a sixth memory cell to said sixth bit line and connecting a second side through a seventh bit line to a source driver circuit; and
connecting a first side of a seventh memory cell comprising a second bit of said one or two bits through said seventh bit line to a source driver circuit and connecting a second side through an eight bit line to a drain bias circuit.

18. The method of claim 17 further comprising connecting said second, third, and fourth bit line to a first source driver circuit, and connecting said fifth, sixth, and seventh bit line to a second source driver circuit.

19. The method of claim 17 further comprising connecting said first and eighth bit lines to a same drain bias circuit.

20. The method of claim 17 further comprising:
connecting a first side of an eighth memory cell adjacent to said first memory cell through a ninth bit line to a drain bias circuit and connecting a second side to said first bit line; and a
connecting a first side of a ninth memory cell adjacent to said seventh memory cell through said eighth bit line and connecting a second side through a tenth bit line to a drain bias circuit.

* * * * *